(12) United States Patent
Juengling

(10) Patent No.: US 6,627,933 B2
(45) Date of Patent: Sep. 30, 2003

(54) METHOD OF FORMING MINIMALLY SPACED WORD LINES

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/277,938

(22) Filed: Oct. 23, 2002

(65) Prior Publication Data

US 2003/0059994 A1 Mar. 27, 2003

Related U.S. Application Data

(62) Division of application No. 09/832,858, filed on Apr. 12, 2001, now Pat. No. 6,548,347.

(51) Int. Cl.⁷ .......................... H01L 29/76; H01L 29/84
(52) U.S. Cl. .................. 257/295; 257/313; 257/317; 257/352; 257/517
(58) Field of Search ................ 257/295–317, 257/347, 357, 367, 517, 518

(56) References Cited

U.S. PATENT DOCUMENTS

| | | | | |
|---|---|---|---|---|
| 5,100,826 A | * | 3/1992 | Dennison | 438/396 |
| 5,597,763 A | | 1/1997 | Sim | |
| 5,654,570 A | | 8/1997 | Agnello | |
| 5,677,563 A | | 10/1997 | Cronin et al. | |
| 5,677,867 A | * | 10/1997 | Hazani | 365/185.01 |
| 5,786,250 A | | 7/1998 | Wu et al. | |
| 5,977,601 A | | 11/1999 | Yang et al. | |
| 6,010,933 A | * | 1/2000 | Cherng | 438/253 |
| 6,133,599 A | | 10/2000 | Sung et al. | |
| 6,134,137 A | * | 10/2000 | Kurth et al. | 365/149 |
| 6,136,716 A | | 10/2000 | Tu | |
| 6,215,690 B1 | | 4/2001 | Lee | |
| 6,225,203 B1 | | 5/2001 | Liu et al. | |
| 6,238,974 B1 | * | 5/2001 | Chern et al. | 438/255 |
| 6,297,090 B1 | | 10/2001 | Kim | |
| 6,365,454 B1 | | 4/2002 | Lee et al. | |
| 6,368,988 B1 | | 4/2002 | Li et al. | |
| 6,372,651 B1 | | 4/2002 | Yang et al. | |
| 6,399,433 B2 | | 6/2002 | Hofmann et al. | |
| 6,410,385 B2 | * | 6/2002 | Kurth et al. | 438/253 |
| 6,426,175 B2 | * | 7/2002 | Furukawa et al. | 430/313 |
| 6,429,106 B1 | | 8/2002 | Wu | |
| 6,451,649 B2 | | 9/2002 | An | |
| 6,451,651 B1 | | 9/2002 | Park et al. | |
| 2002/0000596 A1 | | 1/2002 | Carstensen | |
| 2002/0102863 A1 | | 8/2002 | Beaman | |
| 2002/0132397 A1 | | 9/2002 | Weimer et al. | |
| 2003/0008461 A1 | * | 1/2003 | Forbes et al. | 438/268 |

* cited by examiner

*Primary Examiner*—Michael S. Lebentritt
(74) *Attorney, Agent, or Firm*—Dickstein Shapiro Morin & Oshinsky LLP

(57) ABSTRACT

A method of forming minimally spaced word lines is disclosed. A double exposure technique is employed at the gate formation level. A small trench is defined through gate stack layers by using a tapered etch or spacers to achieve the desired width of the trench. A filler material fills the trench and forms a filler plug. The gate layers adjacent to the trench are then patterned and etched and the filler plug is removed to obtain gate stacks spaced apart by a distance of less than about 400 Angstroms.

10 Claims, 18 Drawing Sheets

METHOD OF FORMING MINIMALLY SPACED WORD LINES

This application is a divisional of application Ser. No. 09/832,858, now U.S. Pat. No. 6,548,347 filed on Apr. 12, 2001, which is incorporated herein by reference.

FIELD OF THE INVENTION

The present invention relates to an improved semiconductor structure for high density device arrays, and in particular to a DRAM cell array and a process for its formation.

BACKGROUND OF THE INVENTION

Two major types of random access memory cells—dynamic and static—are currently used in the semiconductor industry. Dynamic random-access memories (DRAM) can be programmed to store a voltage which represents one of two binary values, but require periodic reprogramming or "refreshing" to maintain this voltage for more than very short time periods. Static random-access memory are so called because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components, a filed effect transistor (FET) and a capacitor.

FIG. 1 illustrates a portion of a DRAM memory circuit containing two neighboring DRAM cells 42. For each cell, the capacitor 44 has two connections, which are located on opposite sides of capacitor 44. The first connection is to a reference voltage, which is typically one half of the internal operating voltage (the voltage corresponding to a logical "1" signal) of the circuit. The second connection is to the drain of the FET 46. The gate of the FET 46 is connected to the word line 48, and the source of the FET is connected to the bit line 50. This connection enables the word line 48 to control access to the capacitor 44 by allowing or preventing a signal (a logical "0" or a logical "1") on the bit line 50 to be written to or read from the capacitor 44.

The manufacturing of a DRAM cell includes the fabrication of a transistor, a capacitor, and several contacts, including one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the capacitor, and the compatibility of array devices with non-array devices.

A drawback of conventional DRAM fabrication is the inability of the process to achieve a minimal space or minimal critical dimension (CD) between two adjacent word lines and, consequently, between two adjacent memory cells. To illustrate this drawback, reference is made to FIG. 2 which shows a top view of a conventional DRAM array layout 20 formed over a semiconductor substrate 10. Four word lines 48a, 48b, 48c and 48d intersect three bit lines 50 to define six field effect transistors 46a, 46b, 46c, 46d, 46e and 46f. The DRAM array layout 20 also illustrates four bit contacts 52 as well as six cell capacitor nodes 44 disposed adjacent to respective field effect transistors. The space between two adjacent word lines, for example between word lines 48b and 48c, is represented in FIG. 2 as dimension D. This space is typically required to optically separate the adjacent word lines during photolithography.

FIG. 3 illustrates a cross-sectional view of the conventional DRAM array layout 20, taken along line 3–3', but at an earlier stage of processing. As shown in FIG. 3, the two adjacent word lines 48b and 48c are spaced apart at the distance D. Also shown formed on the semiconductor substrate 10 are a field oxide region 12 and source and drain regions 14b, 16b, 14e and 16e of the field effect transistors 46b and 46e (FIG. 2), respectively. With increasing packing density of DRAM cells, it is desirable for the distance D (FIGS. 2–3) to decrease to values below 500 Angstroms, and preferably to less than or equal to 300 Angstroms, or even less than 100 Angstroms, but current lithography technologies do not afford these values. The decrease in the distance D between the two adjacent word lines 48b and 48c would in turn confer more device area for the adjacent field effect transistors 46b and 46e, respectively, as well as for the cell capacitor nodes 44 adjacent to field effect transistors 46b and 46e. As known in the art, the cell capacitor nodes, for example, require maximum area to allow self-aligned etches and to achieve good contact resistance.

Conventional folded bit line cells of the 256 Mbit generation with planar devices have been created to a size of at least $8F^2$, where F is the minimum lithographic feature size. If a folded bit line is not used, the cell may be reduced to $6F^2$ or $4F^2$. Cell sizes of $4F^2$ may be achieved by using vertical transistors stacked either below or above the cell capacitors, to form, for example, the so-called "cross-cell points," which have a memory cell located at the intersection of each bit line and each word line. However, these cells are expensive and difficult to fabricate because the structure of the array devices is typically incompatible with that of the non-array devices.

There is needed, therefore, an improved method for fabricating memory structures having word lines which are minimally spaced from each other, as well as a method for decreasing the distance between two adjacent word lines formed on an integrated circuit. There is also a need for decreasing the minimum lithographic feature size in a DRAM array and, consequently, the size of the DRAM cell, as well as a method for increasing the memory cell density.

BRIEF SUMMARY OF THE INVENTION

The present invention provides a double exposure photolithography technique at the gate level for fabricating minimally spaced word lines of a memory cell array.

In one exemplary embodiment, a plurality of gate stack layers covered by an insulating material are formed over a semiconductor substrate. A first mask defines small trenches, with a width of about 400 Angstroms to about 1,000 Angstroms, for electrical separation of adjacent word lines. For this, a tapered etch is used to obtain a tapered opening in the insulating material, of about 100 Angstroms to about 400 Angstroms at the bottom, after which small trenches are etched through the gate stack layers. After formation of the small trenches, the trenches are filled with a filler material. A second mask is used to conventionally pattern and etch the gate stack layers adjacent to the small trenches. After the removal of the filler material from the small trenches, the gate stacks remain minimally spaced on the semiconductor substrate.

In a second exemplary embodiment, a plurality of gate stack layers covered by an insulating material are formed over a semiconductor substrate. A first mask defines small trenches, with a width of about 400 Angstroms to about 1,000 Angstroms, for electrical separation of adjacent word lines. An opening is formed in the insulating material, after which spacers are formed on the sidewalls of the opening so that small trenches, of about 100 Angstroms to about 400 Angstroms, are etched through the gate stack layers. After formation of the small trenches, the trenches are filled with a filler material. A second mask is used to conventionally pattern and etch the gate stack layers adjacent to the small trenches. After the removal of the filler material from the small trenches, the gate stacks remain minimally spaced on the semiconductor substrate.

DETAILED DESCRIPTION OF THE INVENTION

In the following detailed description, reference is made to various exemplary embodiments of the invention. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has an exposed semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The present invention provides a method for fabricating minimally spaced word lines of a memory array on a semiconductor substrate. The present invention employs a double exposure photolithography technique at the gate formation level. A first mask defines small trenches, with a width of about 100 Angstroms to about 400 Angstroms, for electrical separation of adjacent word lines. According to different embodiments, tapered etch or a spacer etch are used to obtain the small trenches through gate stack layers and an insulating layer formed over the gate stack layers. After formation of the small trenches, the trenches are filled with an filler material and a second mask is used for the conventional patterning and etching of the gate stack layers adjacent to the small trenches. After the removal of the filler material from the small trenches, the gate stacks remain minimally spaced on the semiconductor substrate.

Figure 1:
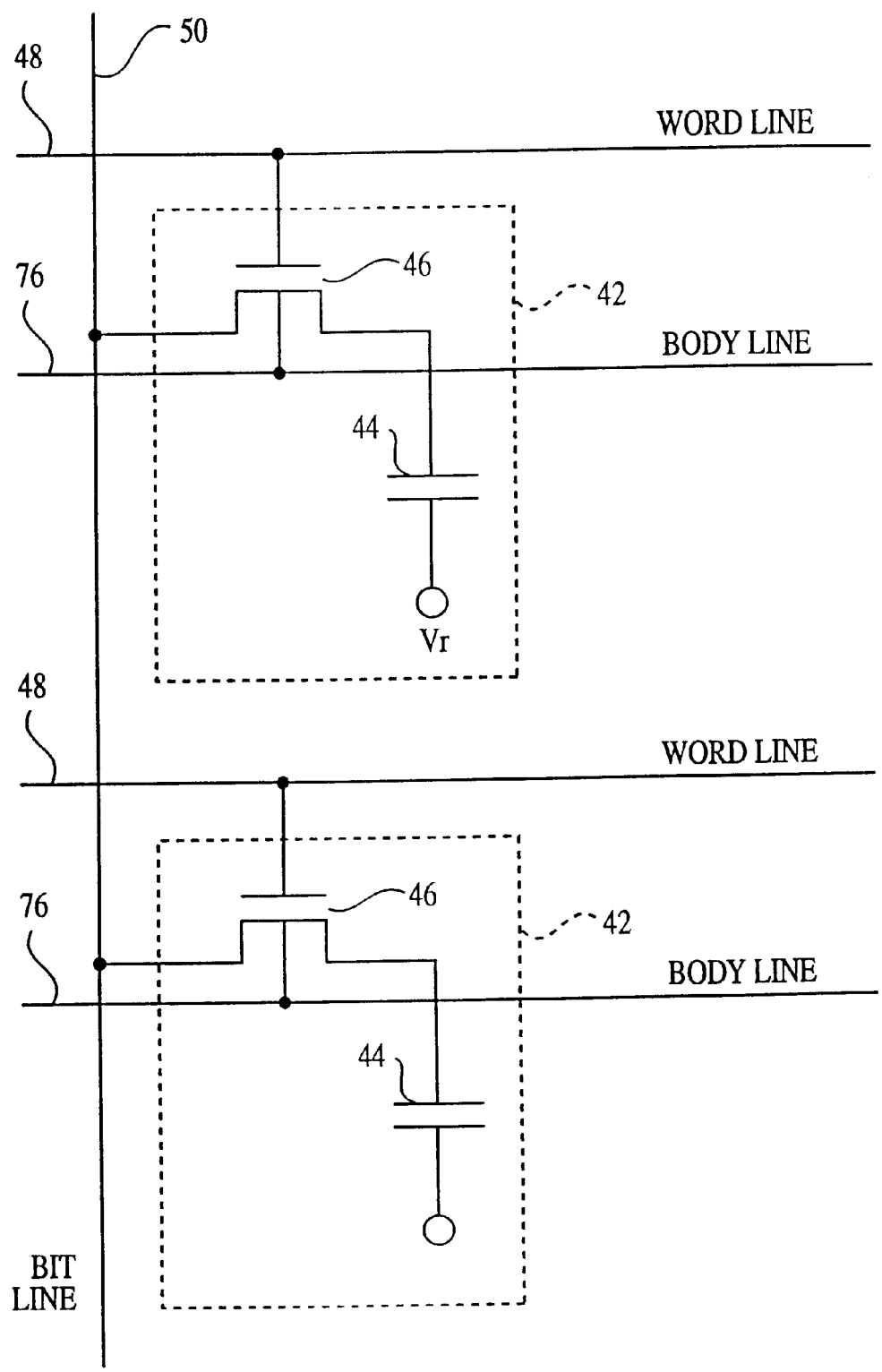
FIG. 1 is a schematic view of a conventional DRAM cell.
Figure 2:
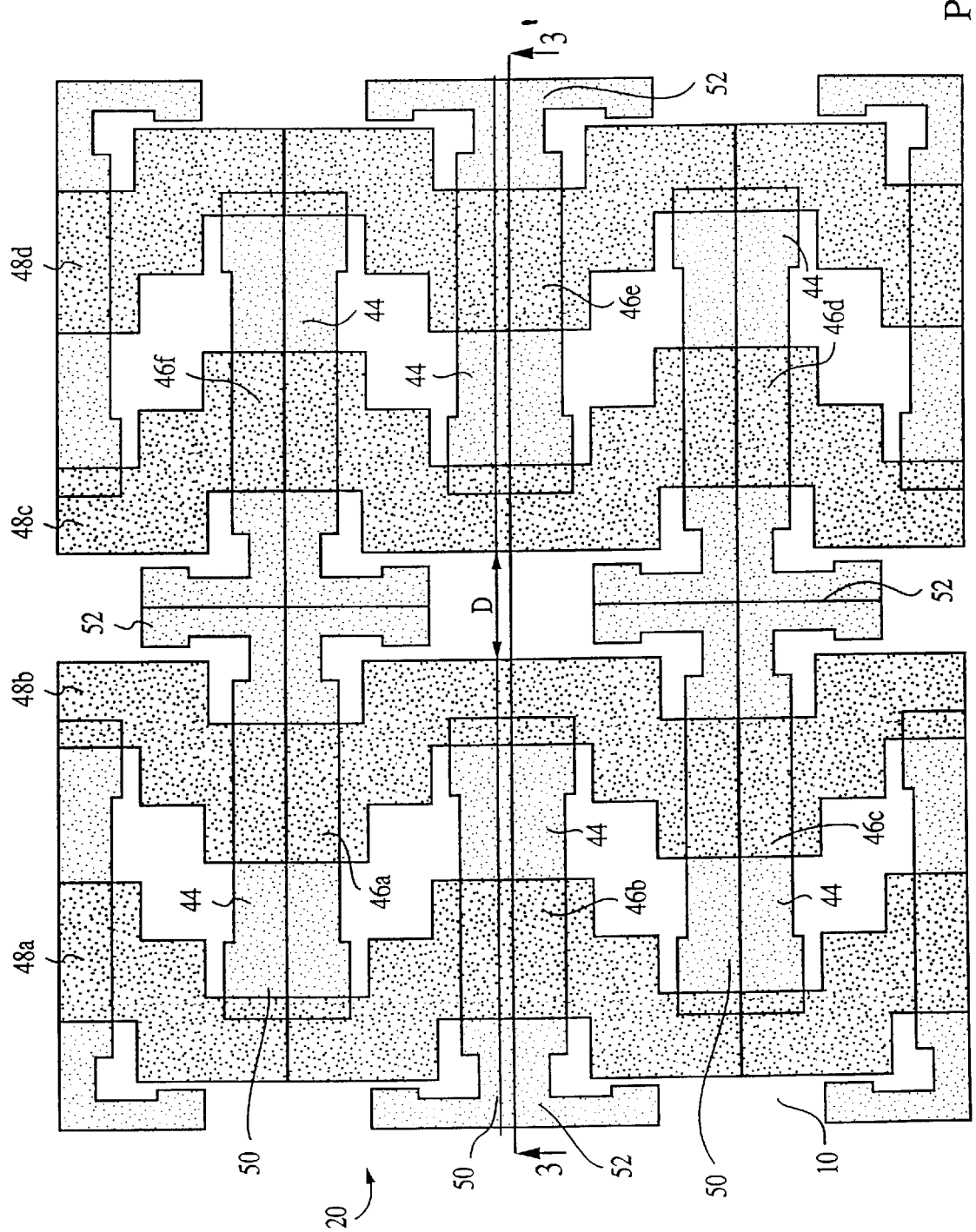
FIG. 2 is a schematic view of a conventional DRAM array layout illustrating the critical dimension CD between two adjacent word lines.
Figure 3:
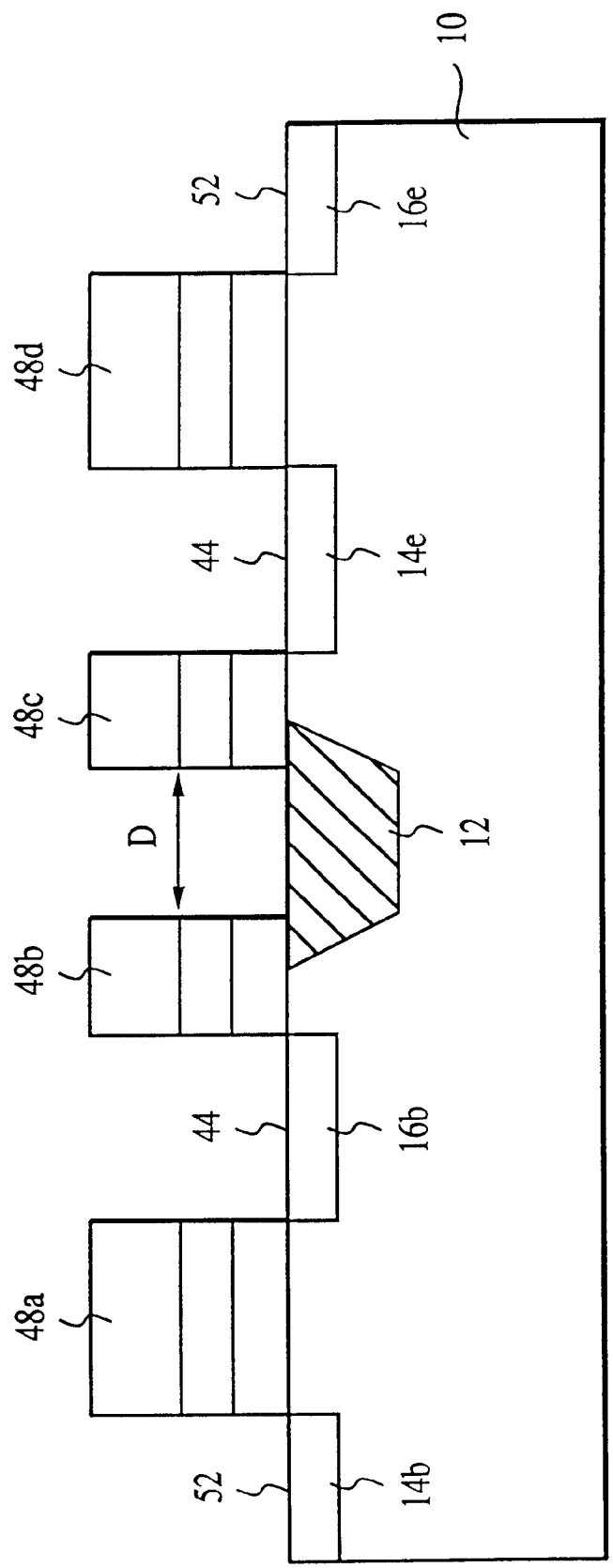
FIG. 3 a cross-sectional view of the conventional DRAM array layout of FIG. 2, taken along line 3–3', but at an earlier stage of processing and illustrating the critical dimension CD between two adjacent gate stacks.
Figure 4:
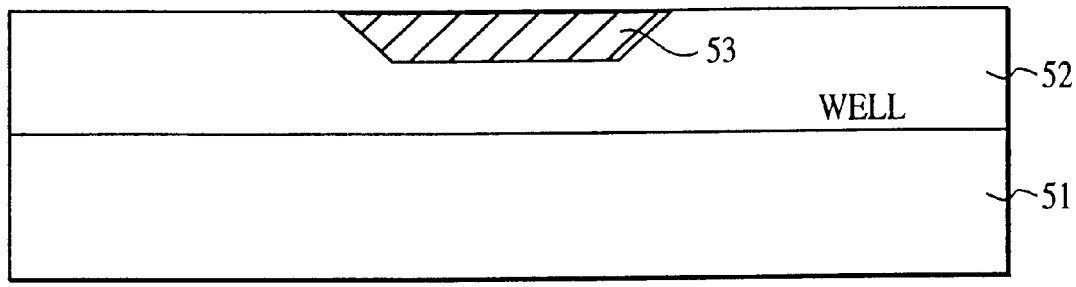
FIG. 4 is a partial cross-sectional view of a semiconductor substrate at an intermediate stage of processing, wherein a DRAM structure will be constructed according to the present invention.
Figure 28:
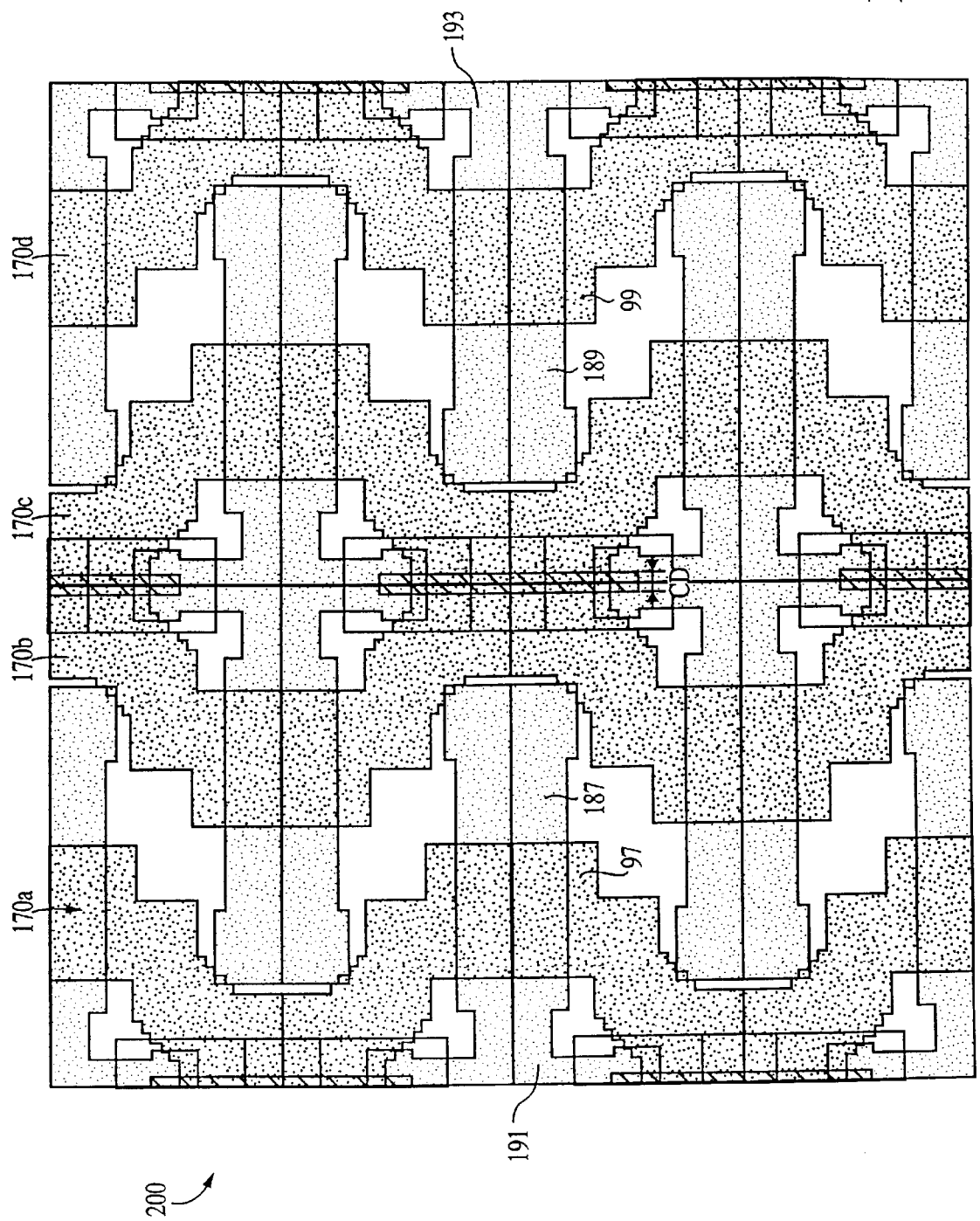
FIG. 28 is a schematic view of DRAM array layout including the DRAM structure fabricated according to the second embodiment of the present invention.

Referring now to the drawings, where like elements are designated by like reference numerals, FIGS. 4–28 illustrate exemplary embodiments of methods of forming minimally spaced word lines of a DRAM memory array 100 (FIG. 19), 200 (FIG. 28). The FIG. 4 structure depicts a portion of a semiconductor substrate 51 having a well 52, which is typically doped to a predetermined conductivity, for example, p-type or n-type, depending on whether NMOS or PMOS transistors will be formed. The structure further includes isolation region 53, which may be a field oxide (FOX) region, for example, and which has been already formed according to conventional semiconductor processing techniques.

Figure 5:
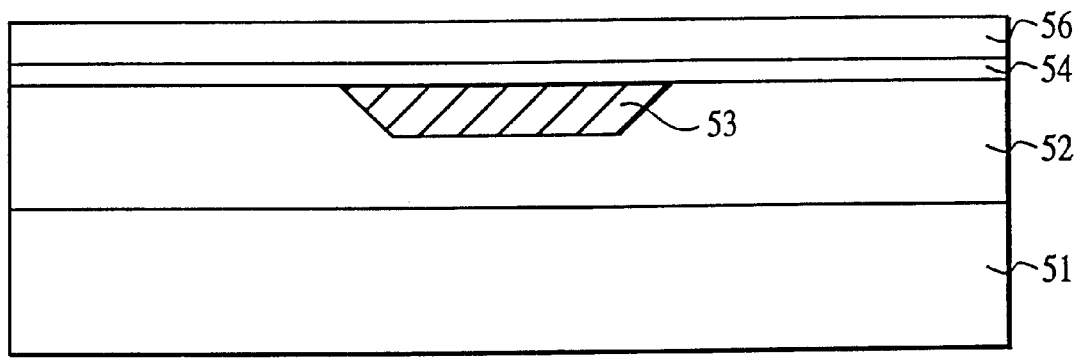
FIG. 5 is a partial cross-sectional view of the DRAM structure of FIG. 4 at a stage of processing subsequent to that shown in FIG. 4.

Next, as illustrated in FIG. 5, a thin oxide layer 54 is deposited or grown over the semiconductor substrate 51 and the isolation region 53 to a thickness of about 50 Angstroms to about 200 Angstroms. The thin oxide layer 54, which will eventually function as a gate oxide, may be formed of silicon oxide, for example, by thermal oxidation of the silicon substrate at about 600° C. to about 800° C. in the presence of oxygen.

A polysilicon layer 56 (FIG. 5) is next formed, to a thickness of about 300 Angstroms to about 3,000 Angstroms, using conventional techniques such as chemical vapor deposition (CVD) or plasma enhanced chemical vapor deposition (PECVD). The polysilicon layer 56 may be also doped by ion implantation, for example with both n-type and p-type dopants through different regions of the wafer, by using photolithographic masking and ion implantation.

Figure 6:
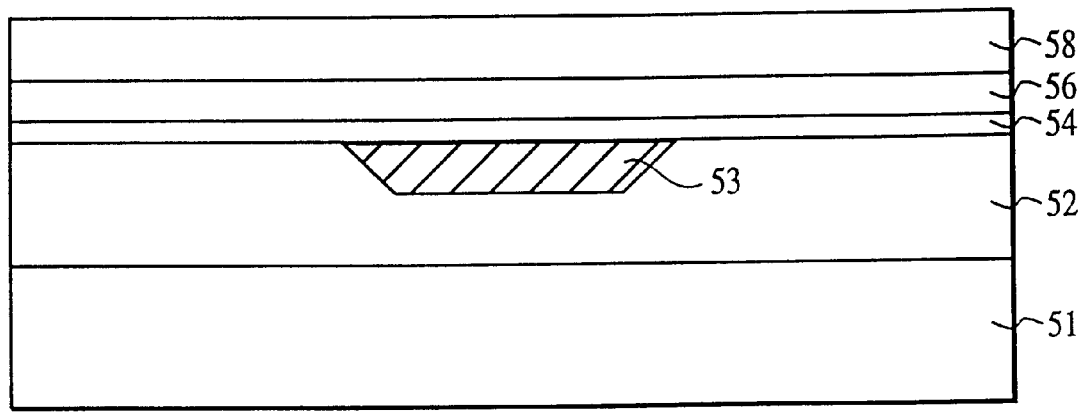
FIG. 6 is a partial cross-sectional view of the DRAM structure of FIG. 4 at a stage of processing subsequent to that shown in FIG. 5.

Referring now to FIG. 6, a metal silicide layer 58 is next formed, to a thickness of about 500 Angstroms to about 1,000 Angstroms, by low pressure chemical vapor deposition (LPCVD) or similar deposition methods. Preferred metal silicides are, for example, tungsten silicides ($WSi_x$) or titanium silicides ($TiSi_x$), which are deposited with fluorine-containing reaction gases, such as $WF_6$ and $SiH_4$. Because the fluorine atoms tend to diffuse through the polysilicon layer 56 and into the thin oxide layer 54 when the gate structure is eventually annealed at high temperatures, a thin diffusion barrier layer (not shown) may be formed between the polysilicon layer 56 and the thin oxide layer 54 to reduce the diffusion of the fluorine atoms.

Figure 7:
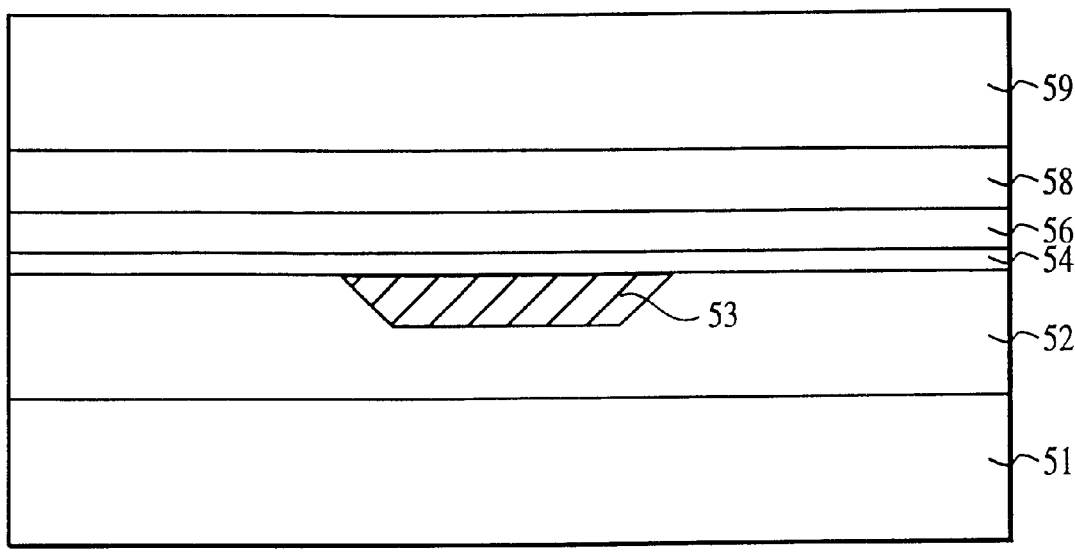
FIG. 7 is a partial cross-sectional view of the DRAM structure of FIG. 4 at a stage of processing subsequent to that shown in FIG. 6.

An insulating layer 59 is next formed over the metal silicide layer 58, as shown in FIG. 7. In an exemplary embodiment of the invention, the insulating layer 59 is blanket deposited by spin coating to a thickness of about 1,000 Angstroms to about 10,000 Angstroms. However, other known deposition methods, such as sputtering by chemical vapor deposition (CVD), plasma enhanced CVD (PECVD) or physical vapor deposition (PVD), may be used also in accordance with the characteristics of the IC device already formed. The insulating layer 59 may be formed of a conventional insulator, for example, a nitride such as $Si_3N_4$, or a thermal oxide of silicon, such as SiO or $SiO_2$. Alternatively, a high temperature polymer, such as a polyimide, or a low dielectric constant inorganic material may also be employed.

Figure 8:
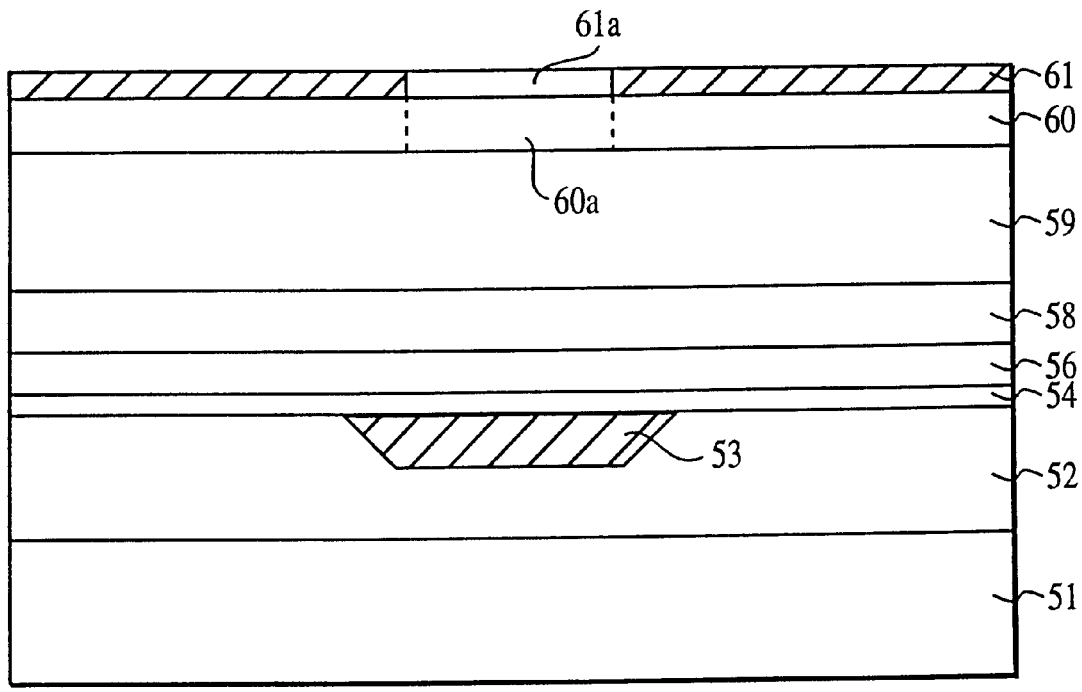
FIG. 8 is a partial cross-sectional view of the DRAM structure of FIG. 4 at a stage of processing subsequent to that shown in FIG. 7.

Next, as illustrated in FIG. 8, a photoresist layer 60 is formed over the insulating layer 59. The photoresist layer 60 is exposed through a mask 61 (FIG. 8) with high-intensity UV light. The mask 61 may include any suitable pattern of opaque and clear regions that may depend, for example, on the desired pattern to be formed in the insulating layer 59. This way, portion 60a (FIG. 8) of the photoresist layer 60 is exposed through portion 61a (FIG. 8) of the mask 61 where a portion of the insulating layer 59 needs to be removed. Although FIG. 8 schematically illustrates mask 56 positioned over the photoresist layer 60, those skilled in the art will appreciate that mask 61 is typically spaced from the photoresist layer 60 and light passing through mask 61 is focussed onto the photoresist layer 60.

Figure 9:
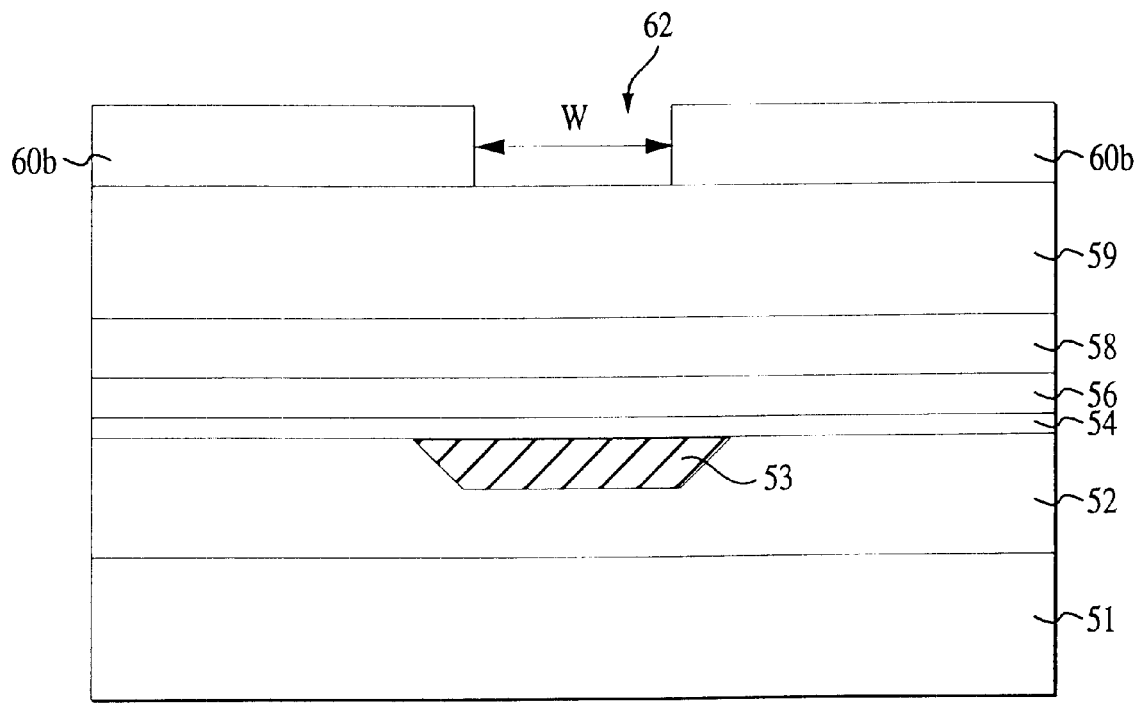
FIG. 9 is a partial cross-sectional view of the DRAM structure of FIG. 4 at a stage of processing subsequent to that shown in FIG. 8.

After exposure and development of the exposed portion 60a and after removal of the mask 61, portions 60b of unexposed and undeveloped photoresist are left over the insulating layer 59. This way, a first opening 62 is formed through the photoresist layer 60 with a width W of about 1,000 Angstroms to about 3,000 Angstroms, as shown in FIG. 9.

Figure 10:
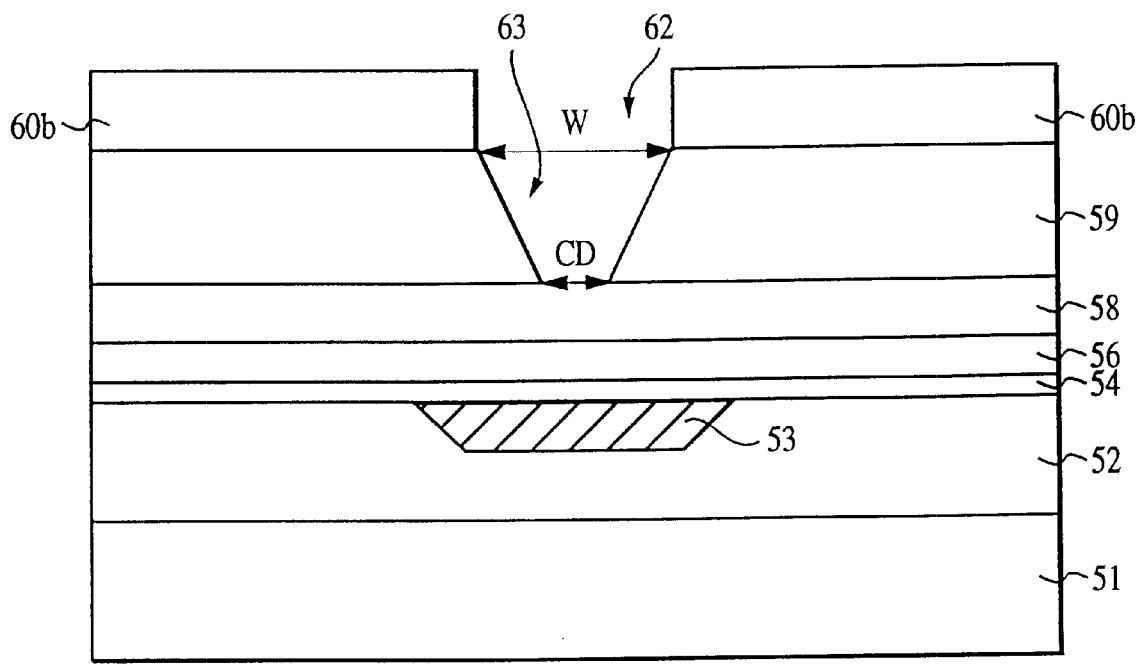
FIG. 10 is a partial cross-sectional view of the DRAM structure of FIG. 4 at a stage of processing subsequent to that shown in FIG. 9 and in accordance with a first embodiment of the present invention.

According to an exemplary embodiment of the invention, a tapered dry etch is next performed through the insulating layer 59 to reach the optimum critical dimension CD in a second opening 63, as illustrated in FIG. 10. The tapered dry etch may be a conventional plasma etch or a reactive ion etch (RIE), for example, which allows control of the exposure rate to define the critical dimension CD (FIG. 10) in the second opening 63, in accordance with the particular characteristics of the insulating material of the insulating layer 59. For example, if the insulating layer 59 is formed of silicon nitride ($Si_3N_4$), a plasma etch may be employed to allow the deposition of long polymer chains on the sidewalls of the second opening 63. For example, a $CHF_3$ or $CF_4$ plasma may be used so that carbon atoms, from the $CHF_3$/$CF_4$ plasma or the photoresist 60, react with the fluorine atoms from the $CHF_3$/$CF_4$ plasma to form Teflon that deposits on the sidewalls of the second opening 63. By using a tapered etch, the second opening 63 is defined by an upper width W of about 1,000 Angstroms to about 3,000 Angstroms and by a lower critical dimension CD of about 100 Angstroms to about 400 Angstroms, more preferably of about 100 Angstroms to about 300 Angstroms.

Figure 11:
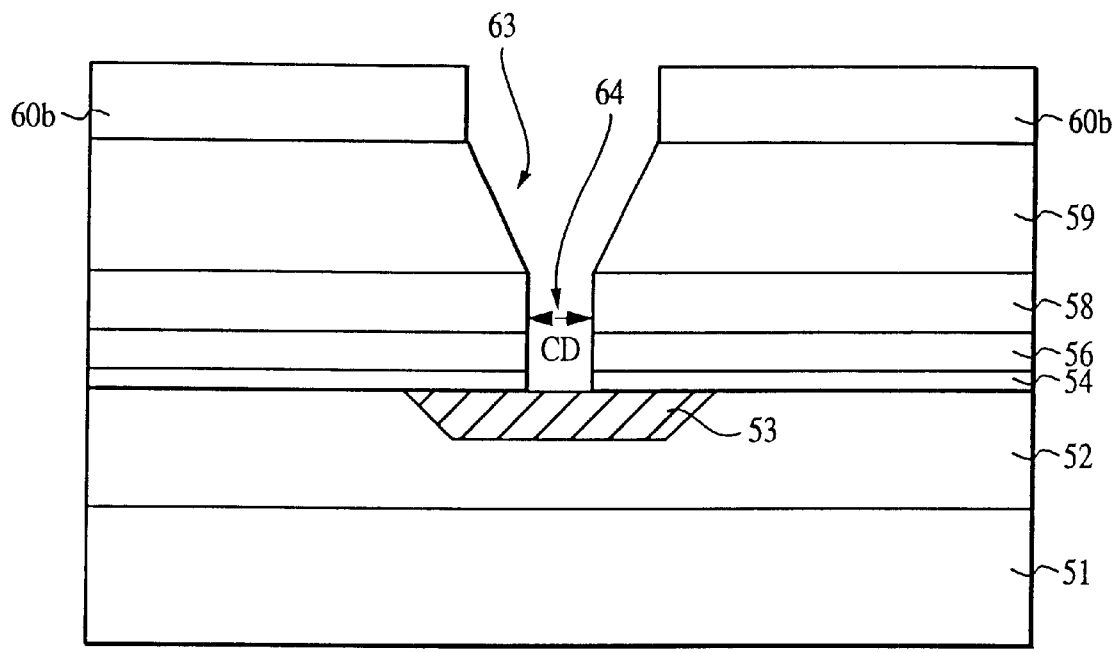
FIG. 11 is a partial cross-sectional view of the DRAM structure of FIG. 9 at a stage of processing subsequent to that shown in FIG. 10.
Figure 12:
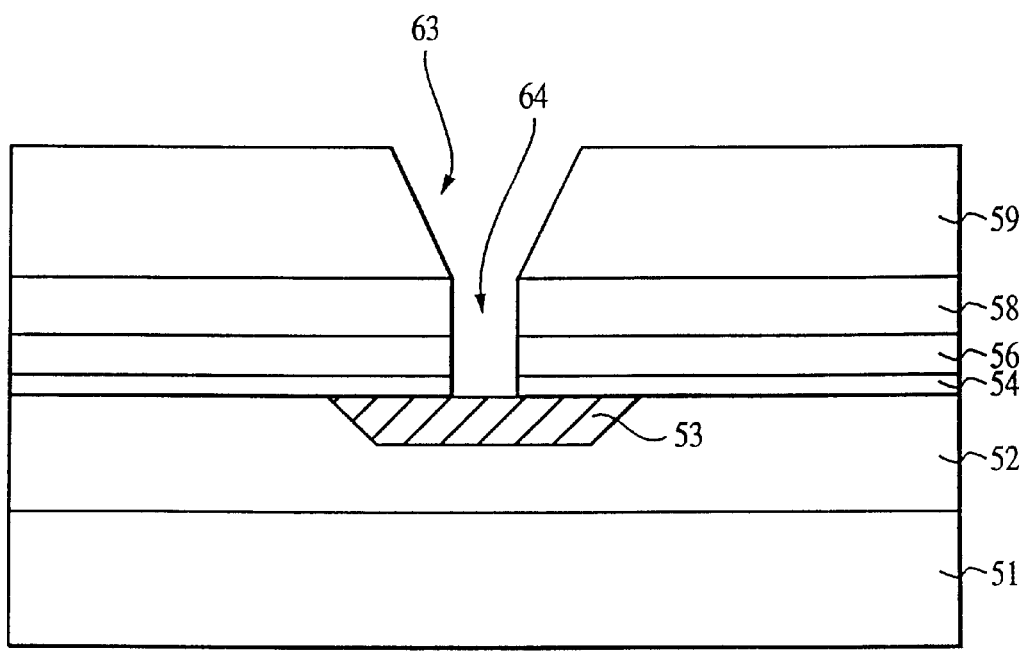
FIG. 12 is a partial cross-sectional view of the DRAM structure of FIG. 9 at a stage of processing subsequent to that shown in FIG. 11.
Figure 13:
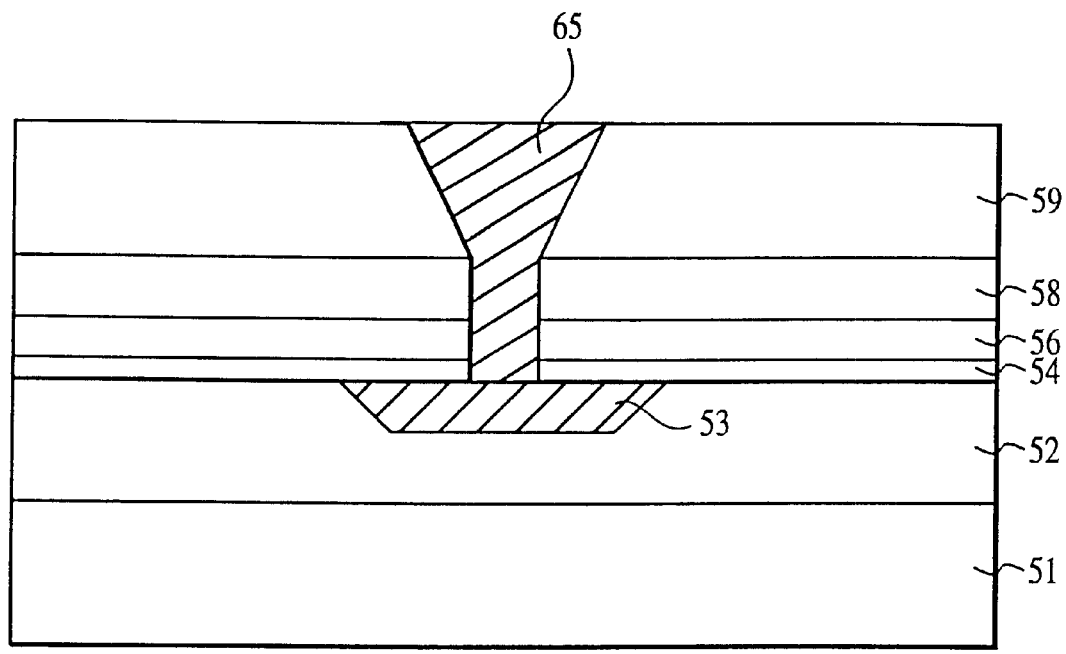
FIG. 13 is a partial cross-sectional view of the DRAM structure of FIG. 9 at a stage of processing subsequent to that shown in FIG. 12.
Figure 14:
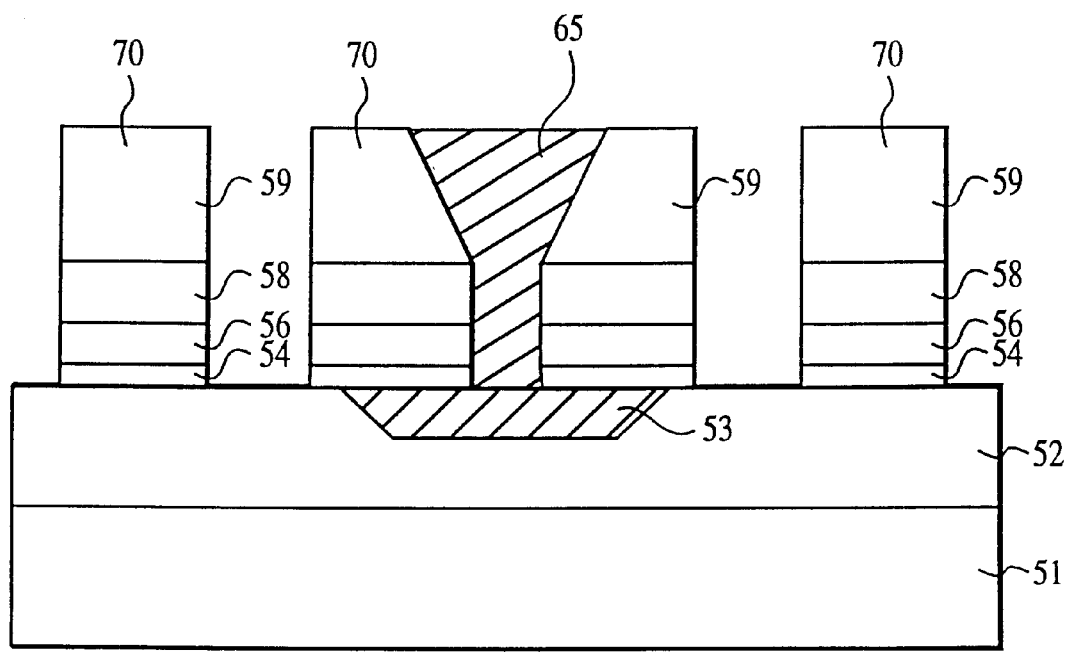
FIG. 14 is a partial cross-sectional view of the DRAM structure of FIG. 9 at a stage of processing subsequent to that shown in FIG. 13.

Reference is now made to FIG. 11. After formation of the second opening 63 (FIG. 10) through the insulating layer 59, the structure of FIG. 10 is next etched to form a trench 64 through the metal silicide layer 58, the polysilicon layer 56 and the thin oxide layer 54. The trench 64 has a critical dimension CD width of about 100 Angstroms to about 400 Angstroms, more preferably of about 100 Angstroms to about 300 Angstroms. The etchant may be a low plasma density with good vertical profile and high selectivity to the insulating material of the insulating layer 59, which may be silicon nitride, for example. Subsequent to the formation of the trench 64, the remaining portions 60b of the photoresist layer 60 are then removed by chemicals, such as hot acetone or methylethylketone, or by flooding the substrate 51 with UV irradiation to degrade the remaining portions 60b to obtain the structure of FIG. 12.

Subsequent to the formation of the trench 64 (FIGS. 11–12) and the removal of the photoresist portions 60b, both the trench 64 and the second opening 63 are filled with a filler material 65 (FIG. 13), which may be blanket deposited by spin coating or sputtered by chemical vapor deposition (CVD), plasma enhanced CVD (PECVD) or physical vapor deposition (PVD), and then planarized by chemical mechanical polishing (CMP), for example. The filler material 65 may be formed of a conventional insulator, for example, a nitride such as $Si_3N_4$, or a thermal oxide of silicon such as SiO or $SiO_2$. In a preferred embodiment of the invention, the filler material 65 is formed of a material similar to that of the insulating layer 59.

Figure 15:
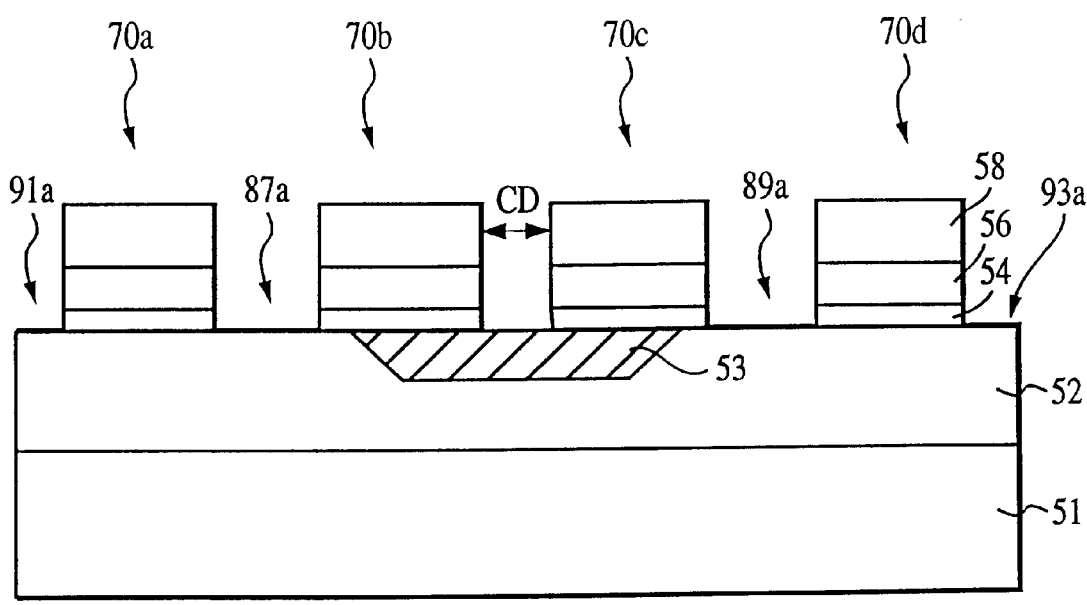
FIG. 15 is a partial cross-sectional view of the DRAM structure of FIG. 9 at a stage of processing subsequent to that shown in FIG. 14.
Figure 16:
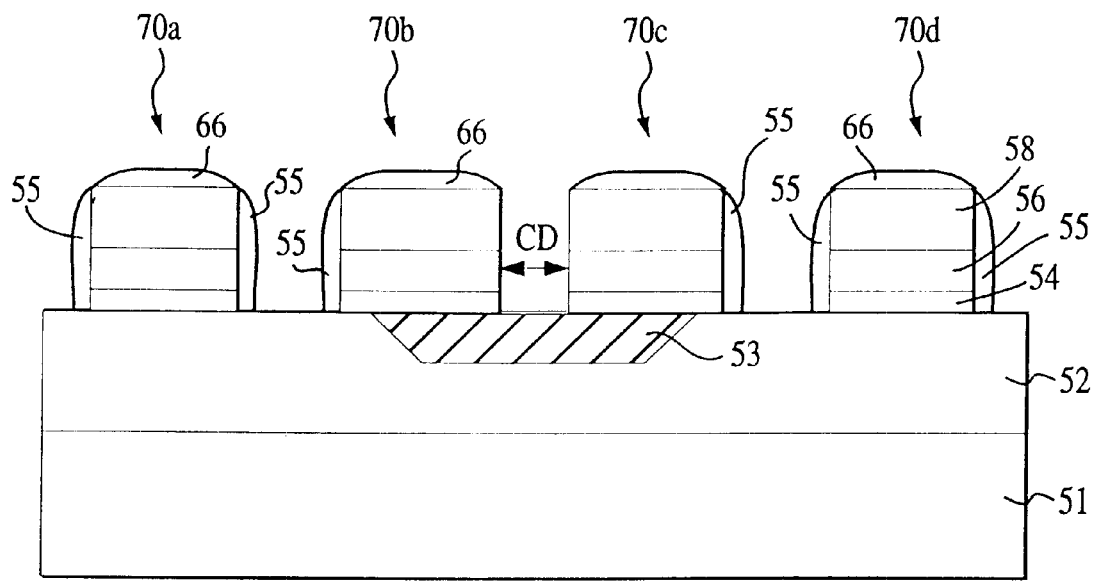
FIG. 16 is a partial cross-sectional view of the DRAM structure of FIG. 9 at a stage of processing subsequent to that shown in FIG. 15.
Figure 17:
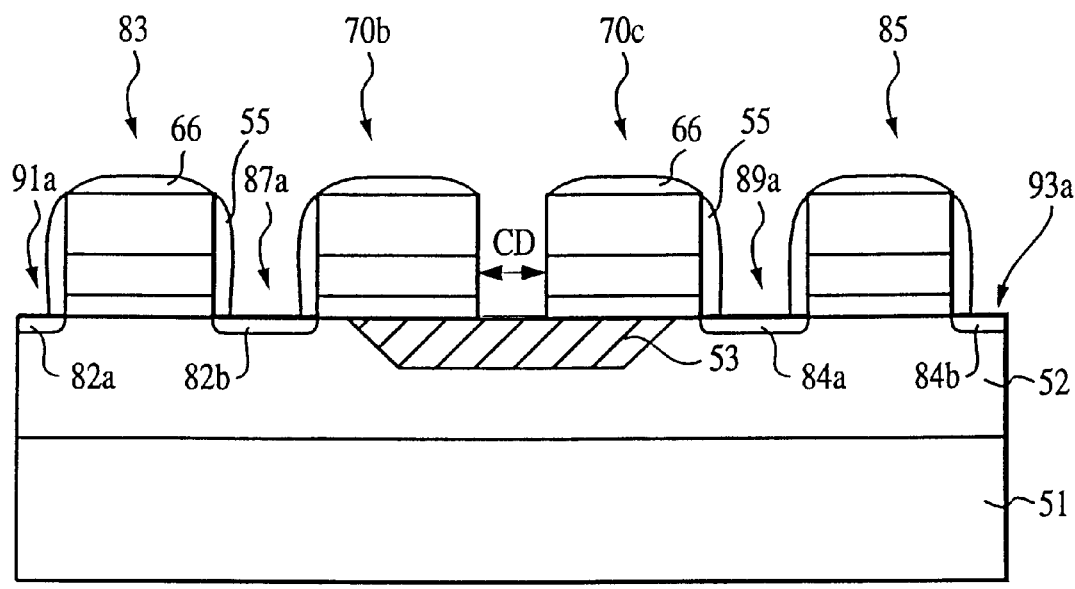
FIG. 17 is a partial cross-sectional view of the DRAM structure of FIG. 9 at a stage of processing subsequent to that shown in FIG. 16.
Figure 18:
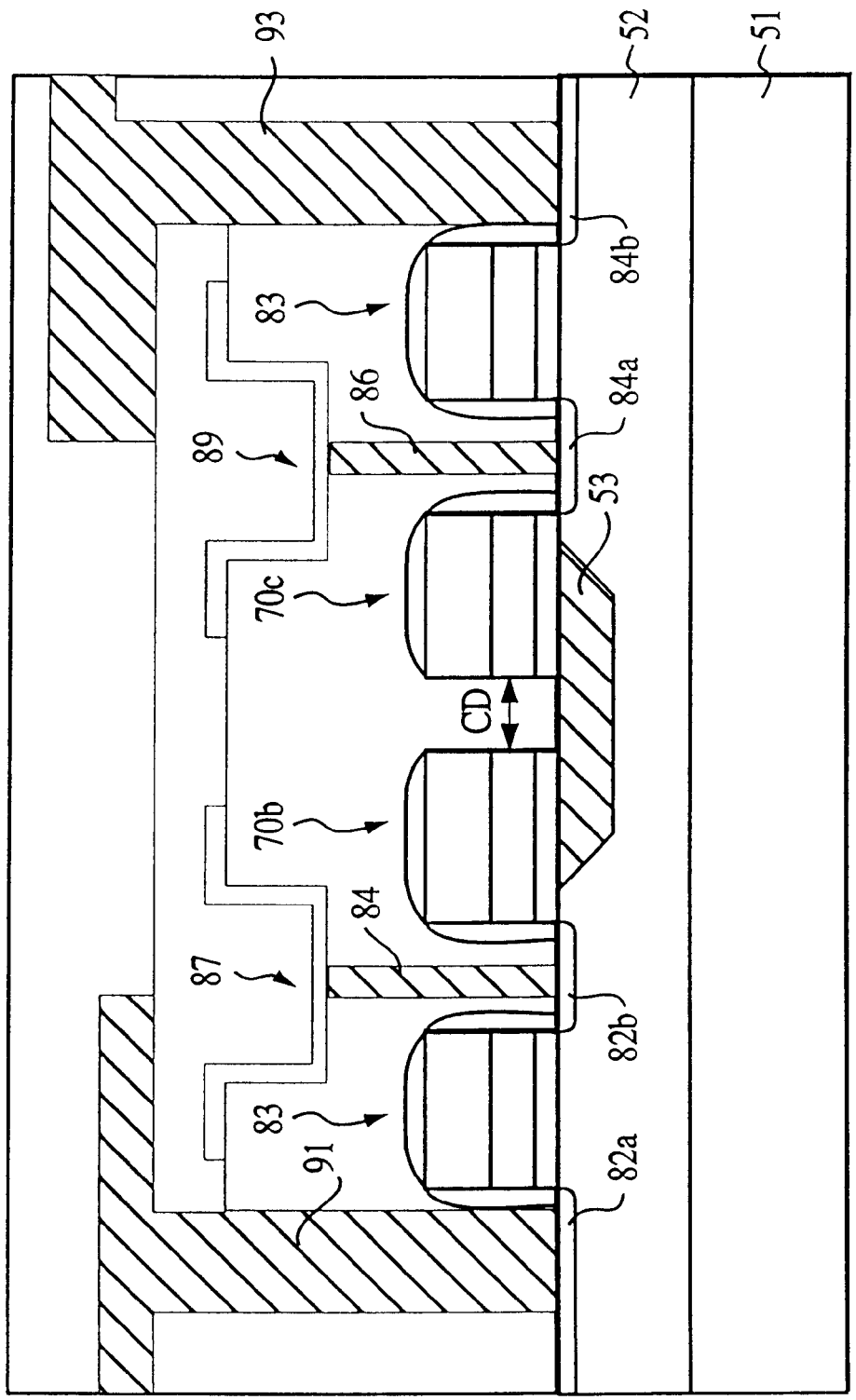
FIG. 18 is a partial cross-sectional view of the DRAM structure of FIG. 9 at a stage of processing subsequent to that shown in FIG. 17.

The processing steps for the gate stack formation and for completion of the DRAM memory array 100 (FIG. 19) are now carried out. As such, using conventional photolithography and etching techniques, the thin oxide layer 54, the polysilicon layer 56, the metal silicide layer 58 and the insulating layer 59 are patterned and etched for the second time to form the desired gate stack structures 70, illustrated in FIG. 14. Subsequent to the removal of the insulating material 59 and of the filler material 65 from atop the gate stack structures 70, four gate stacks 70a, 70b, 70c and 70d (FIG. 15) are formed over the semiconductor substrate 51. Adjacent gate stacks 70b, 70c formed by the method of the present invention are minimally spaced apart by critical dimension CD, which is of about 100 Angstroms to about 400 Angstroms, more preferably of about 100 Angstroms to about 300 Angstroms. Capacitor cell nodes 87a and 89a are defined by adjacent gate stacks 70a, 70b, 70c and 70d, respectively, as shown in FIG. 15. Two bit contacts 91a and 93a are also defined by the gate stacks 70a and 70d, respectively, as also shown in FIG. 15.

Figure 19:
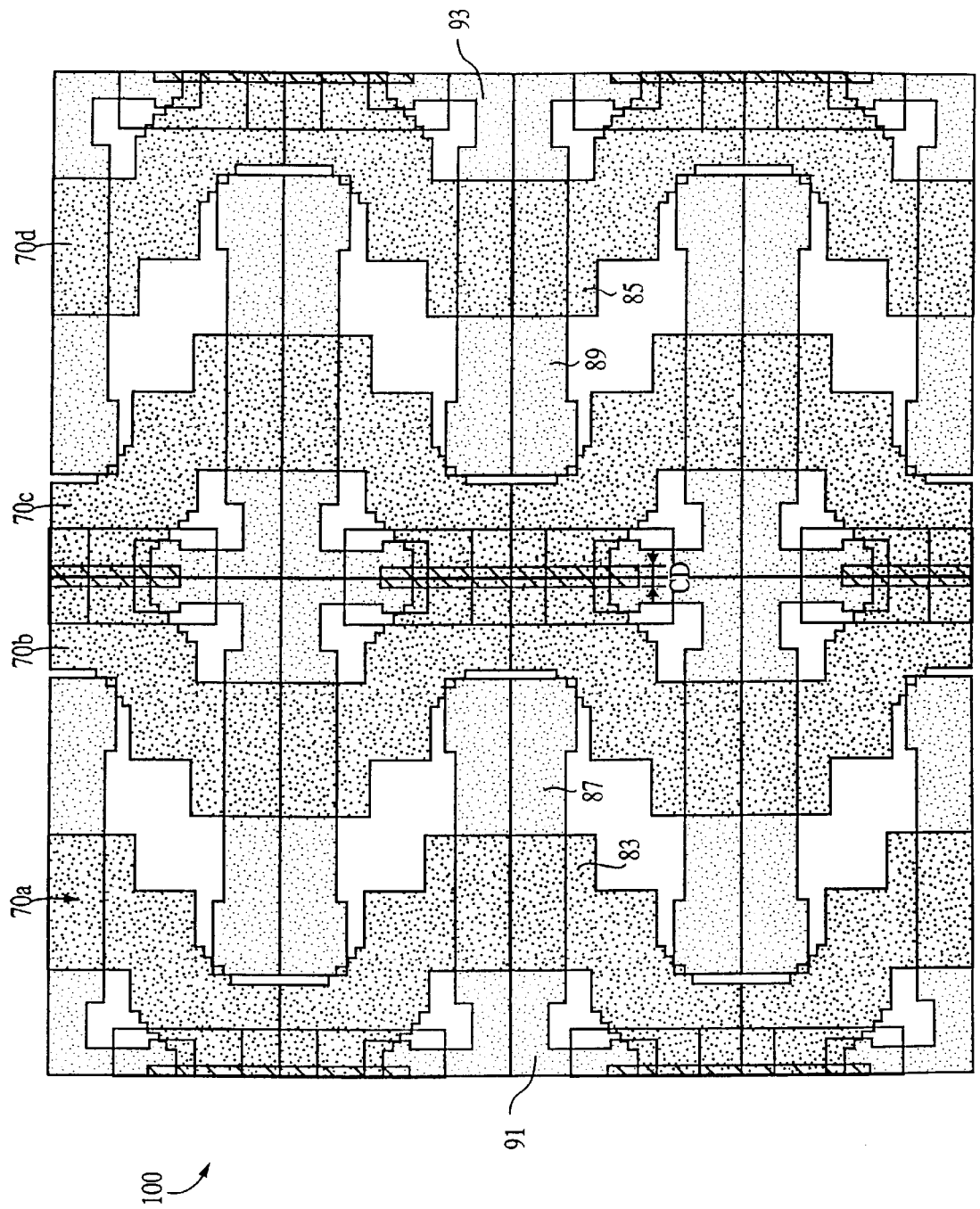
FIG. 19 is a schematic view of DRAM array layout including the DRAM structure fabricated according to the first embodiment of the present invention.

After the formation of the gate stacks 70a, 70b, 70c and 70d (FIG. 15), nitride spacers 55 (FIG. 16) and nitride caps 66 (FIG. 16) may be formed on the sidewalls and tops of the gate stacks, and source and drain regions 82a, 82b and 84a, 84b (FIG. 17) are formed to complete the formation of the field effect transistors 83 and 85. Multi-layer capacitors 87 and 89 (FIG. 18) and associated conductive plugs 84, 86 (FIG. 18), and bit conductors 91 and 93 (FIG. 18) are formed to complete the formation of the DRAM array 100 (FIG. 19). A top view of the DRAM array 100 is illustrated in FIG. 19, where the word lines 70b and 70c are spaced apart by the minimal distance CD.

Figure 20:
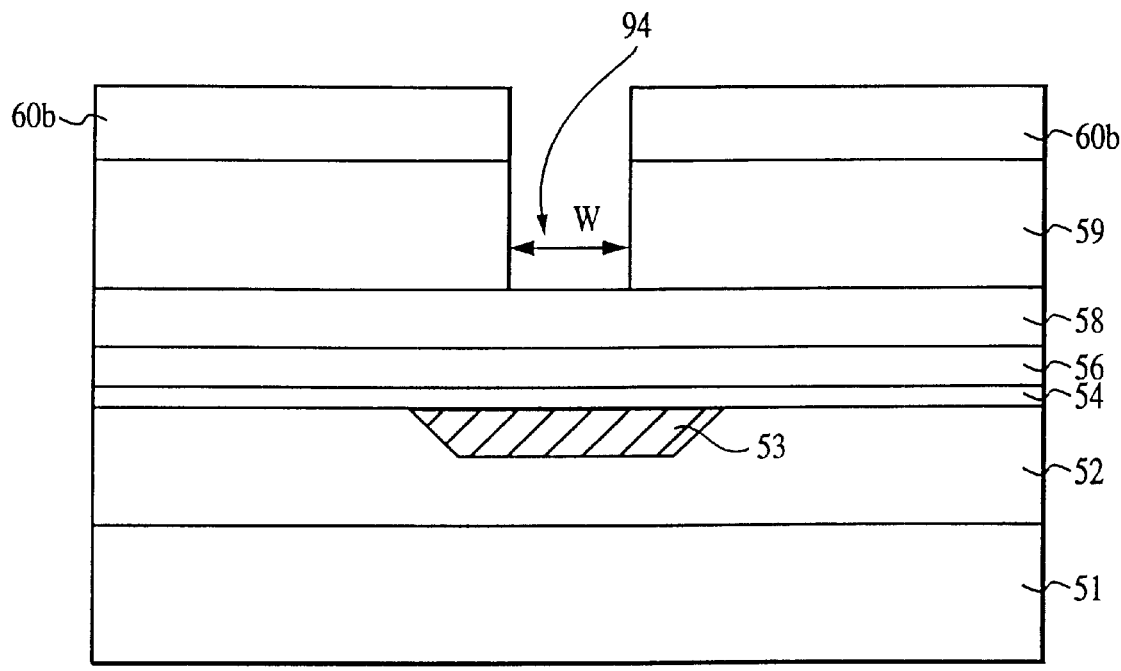
FIG. 20 is a partial cross-sectional view of the DRAM structure of FIG. 4 at a stage of processing subsequent to that shown in FIG. 9 and in accordance with a second embodiment of the present invention.

In yet another embodiment of the invention, the word lines of the DRAM array 100 may be minimally spaced apart by using a spacer etch instead of the tapered etch, which was described above. This embodiment is illustrated in FIGS. 20–28. FIG. 20 is an illustration of the FIG. 9 structure, but at a stage of processing subsequent to that shown in FIG. 9. As shown in FIG. 20, a third opening 94 is formed within the insulating layer 59, by vertically etching the insulating layer 59 with a dry etch, for example, to a width W of about 1,000 Angstroms to about 3,000 Angstroms.

Figure 21:
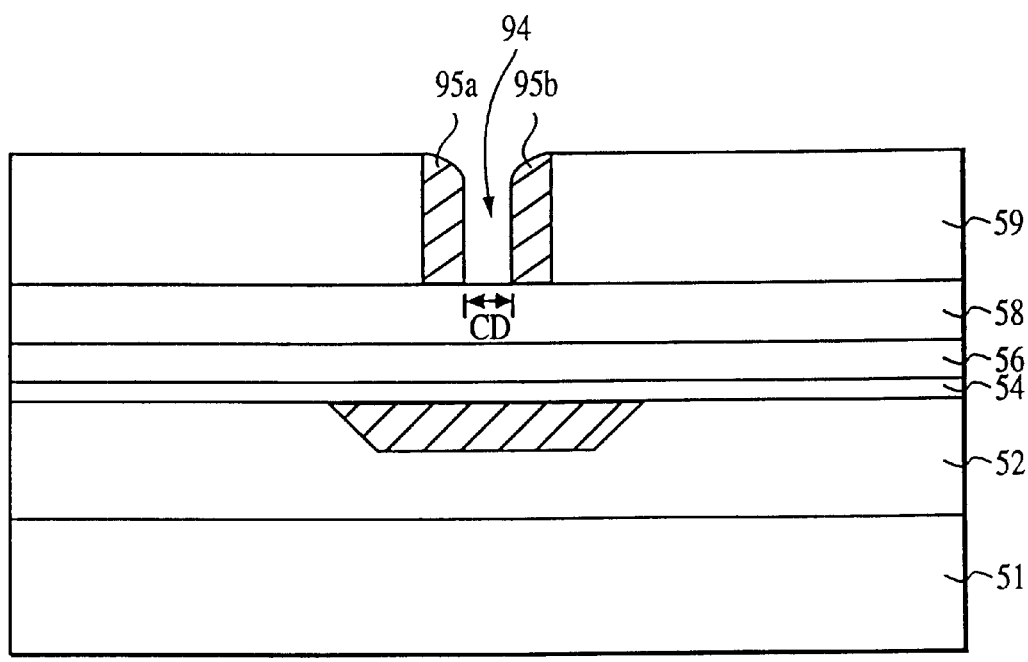
FIG. 21 is a partial cross-sectional view of the DRAM structure of FIG. 9 at a stage of processing subsequent to that shown in FIG. 20.
Figure 22:
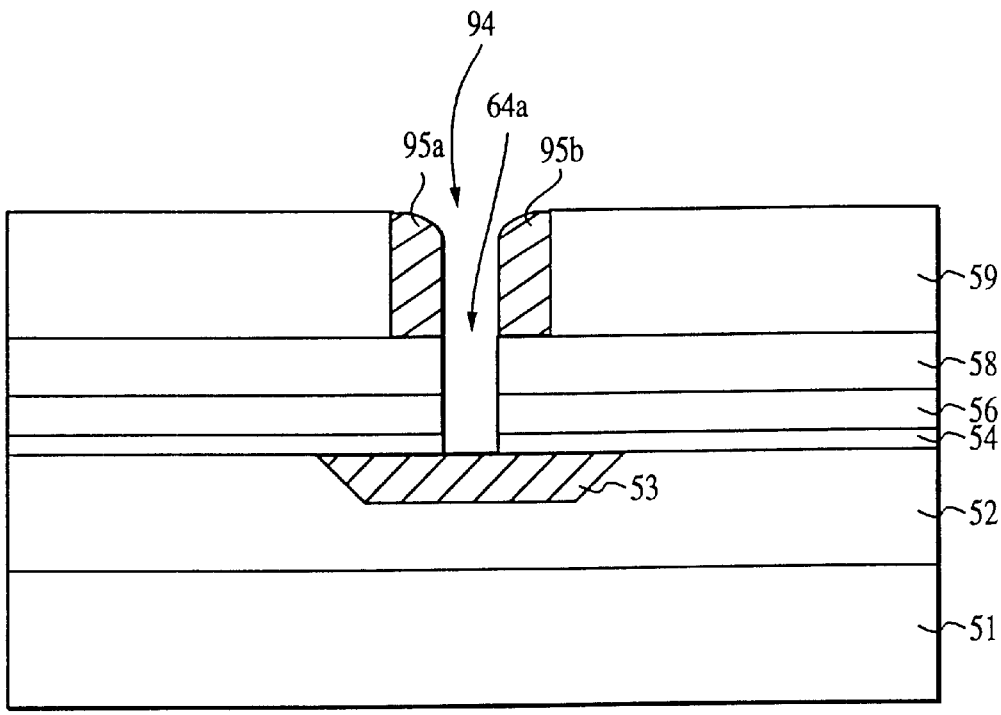
FIG. 22 is a partial cross-sectional view of the DRAM structure of FIG. 9 at a stage of processing subsequent to that shown in FIG. 21.
Figure 23:
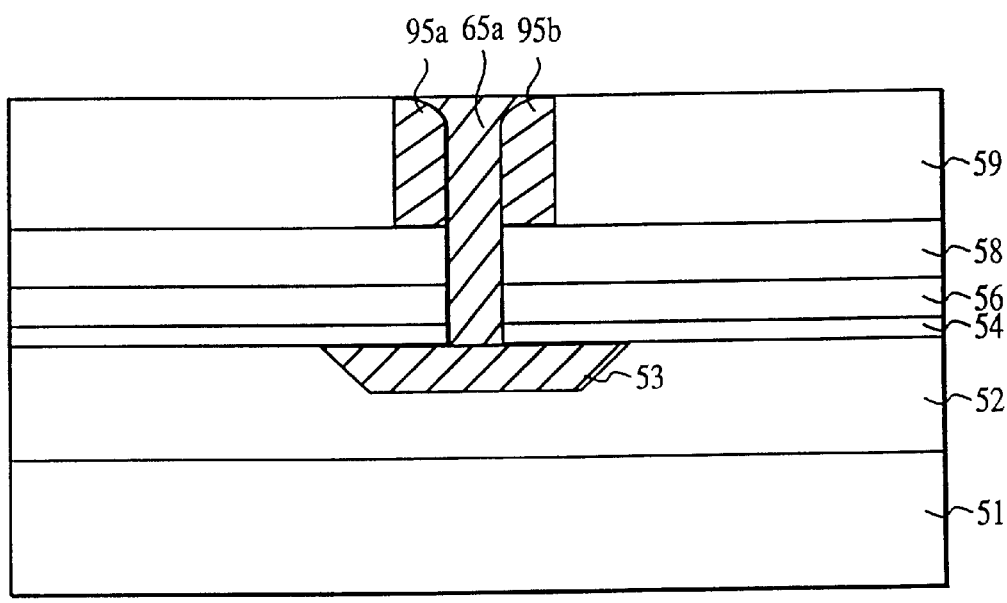
FIG. 23 is a partial cross-sectional view of the DRAM structure of FIG. 9 at a stage of processing subsequent to that shown in FIG. 22.
Figure 24:
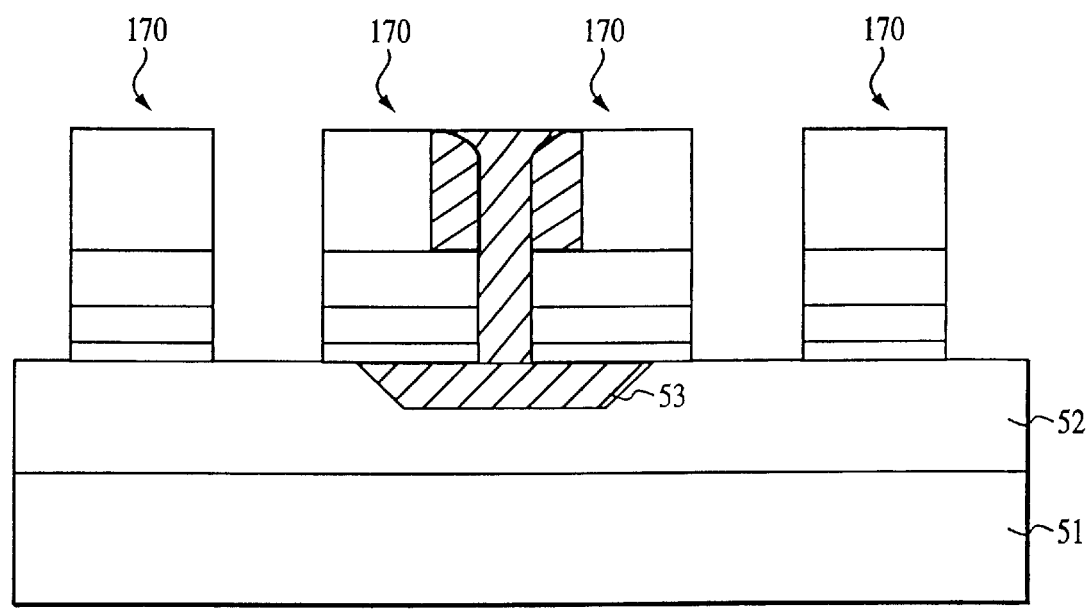
FIG. 24 is a partial cross-sectional view of the DRAM structure of FIG. 9 at a stage of processing subsequent to that shown in FIG. 23.

After removal of the photoresist 60b, a pair of spacers 95a, 95b are formed on the inner sidewalls of the third opening 94, as shown in FIG. 21. The spacers 95a, 95b are formed on the sidewalls of the third opening 94 by deposition, for example, each to a thickness of about 450 Angstroms to about 1,300 Angstroms. This way, the width W (FIG. 20) of the third opening 94 is further reduced to achieve optimum critical dimension CD, as illustrated in FIG. 21. The spacers 95a, 95b may be formed of a nitride material, for example silicon nitride ($Si_3N_4$), but other insulating materials such as oxides may be employed also, as desired.

Subsequent to the spacer formation, the structure of FIG. 21 is etched to form a trench 64a (FIG. 22) through the metal silicide layer 58, the polysilicon layer 56 and the thin oxide layer 54. The trench 64a has a critical dimension CD of about 100 Angstroms to about 400 Angstroms, more preferably of about 100 Angstroms to about 300 Angstroms. The etchant may be a low plasma density with good vertical profile, high selectivity to the insulating material of the insulating layer 59, which may be silicon nitride, for example, and which could stop on the field oxide region 53.

Subsequent to the formation of the trench 64a (FIG. 22), both the third opening 94 and the trench 64a are filled with a filler material 65a (FIG. 23), which may be blanket deposited by spin coating or sputtered by chemical vapor deposition (CVD), plasma enhanced CVD (PECVD) or physical vapor deposition (PVD), and then planarized by chemical mechanical polishing (CMP), for example. As in the previous embodiment, the filler material 65a may be formed of a conventional insulator, for example, a nitride such as $Si_3N_4$, or a thermal oxide of silicon, such as SiO or $SiO_2$. In a preferred embodiment of the invention, the filler material 65a is formed of a material similar to that of the insulating layer 59 and/or the spacers 95a, 95b.

Figure 25:
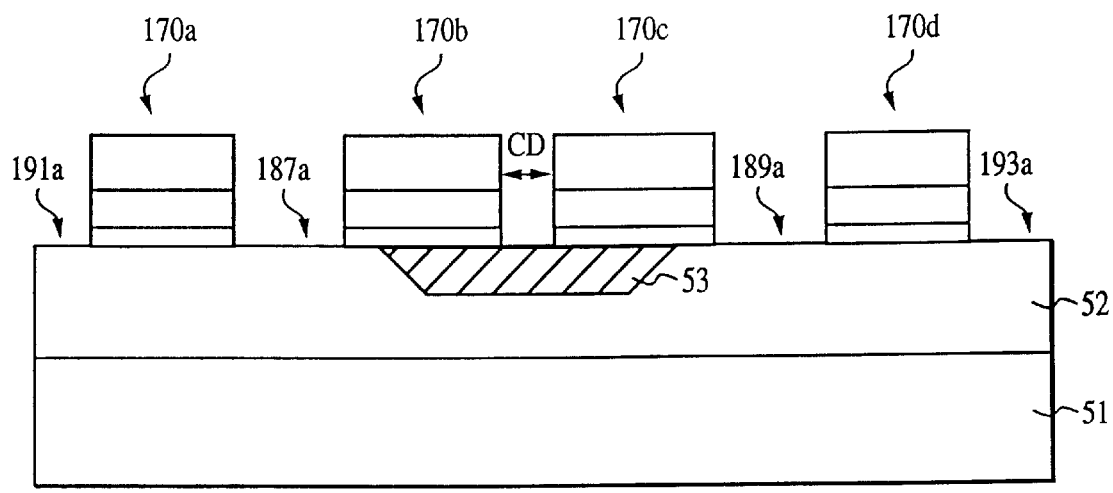
FIG. 25 is a partial cross-sectional view of the DRAM structure of FIG. 9 at a stage of processing subsequent to that shown in FIG. 24.

At this point, the processing steps for the gate stack formation proceed as described above with reference to FIGS. 14–18. As such, using conventional photolithography and etching techniques, the thin oxide layer 54, the polysilicon layer 56, the metal silicide layer 58 and the insulating layer 59 are patterned and etched to form the desired gate stack structures 170, illustrated in FIG. 24. Subsequent to the removal of the insulating material 59 and of the filler material 65a from atop the gate stack structures 170, four gate stacks 170a, 170b, 170c and 170d (FIG. 25) are left over the semiconductor substrate 51. Adjacent gate stacks 170b and 170c formed by a method of the present invention are minimally spaced apart by the critical dimension CD, which is of about 100 Angstroms to about 400 Angstroms, more preferably of about 100 Angstroms to about 300 Angstroms. Capacitor cell nodes 187a and 189a are defined by adjacent gate stacks 170a, 170b, and 170c, 170d, respectively, as shown in FIG. 25. Two bit contacts 191a and 193a are also defined by the gate stacks 170a and 170d, respectively, as also shown in FIG. 25.

Figure 26:
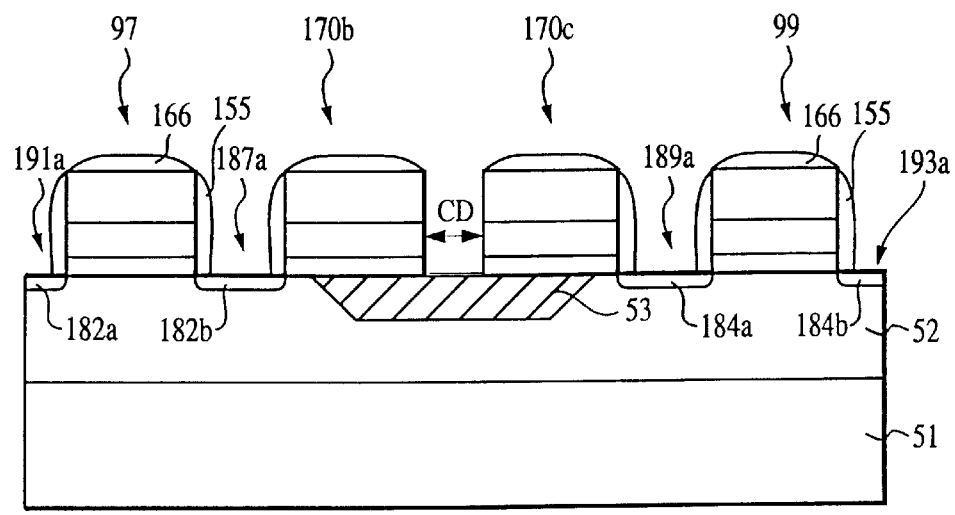
FIG. 26 is a partial cross-sectional view of the DRAM structure of FIG. 9 at a stage of processing subsequent to that shown in FIG. 25.
Figure 27:
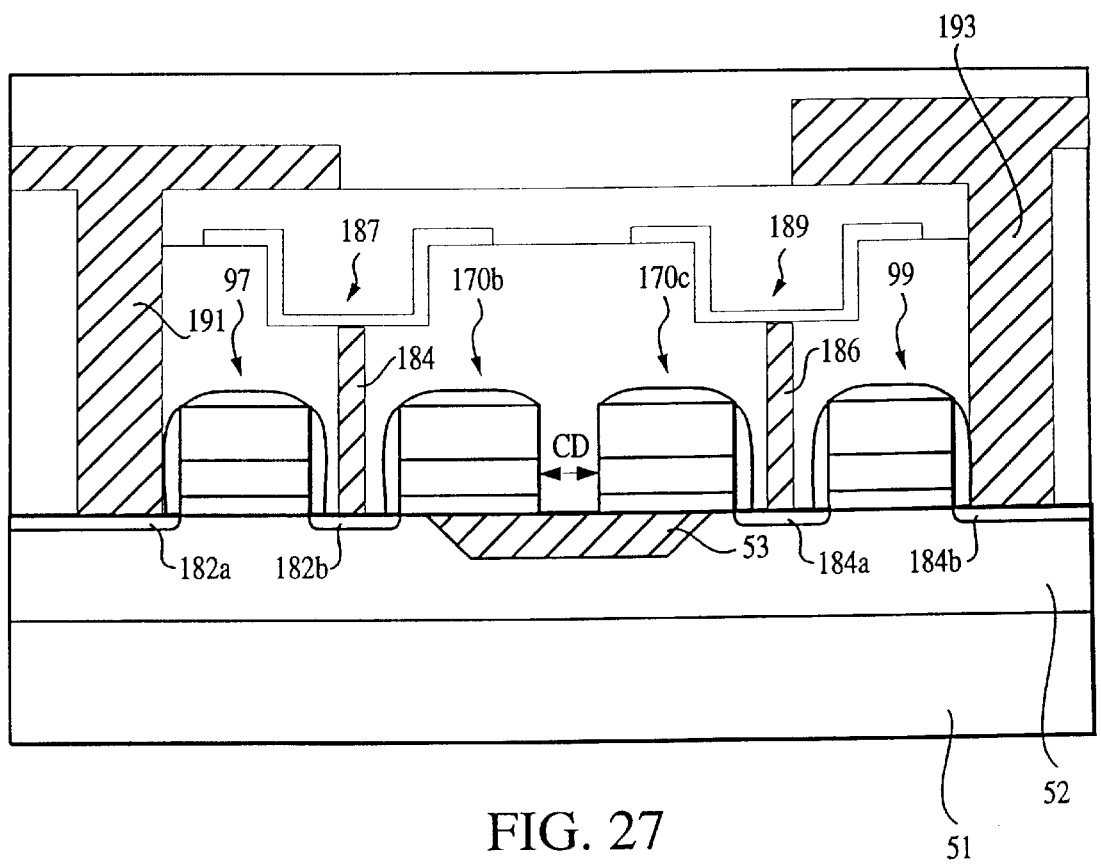
FIG. 27 is a partial cross-sectional view of the DRAM structure of FIG. 9 at a stage of processing subsequent to that shown in FIG. 26.

After the formation of the gate stacks 170a, 170b, 170c and 170d (FIG. 25), nitride caps 166 (FIG. 26) and nitride spacers 155 (FIG. 26) may be formed on the sidewalls and tops of the gate stacks so that source and drain regions 182a, 182b, 184a and 184b (FIG. 26) are formed to complete the formation of the field effect transistors 97 and 99 (FIG. 26). Multi-layer capacitors 187 and 189 (FIG. 27) and associated conductive plugs 184, 186, and bit conductors 191 and 193 (FIG. 27) are formed to complete the formation of a DRAM array 200 (FIG. 28). A top view of the DRAM array 200 is illustrated in FIG. 28, where the word lines 170b and 170c are spaced apart at minimal distance CD.

Figure 29:
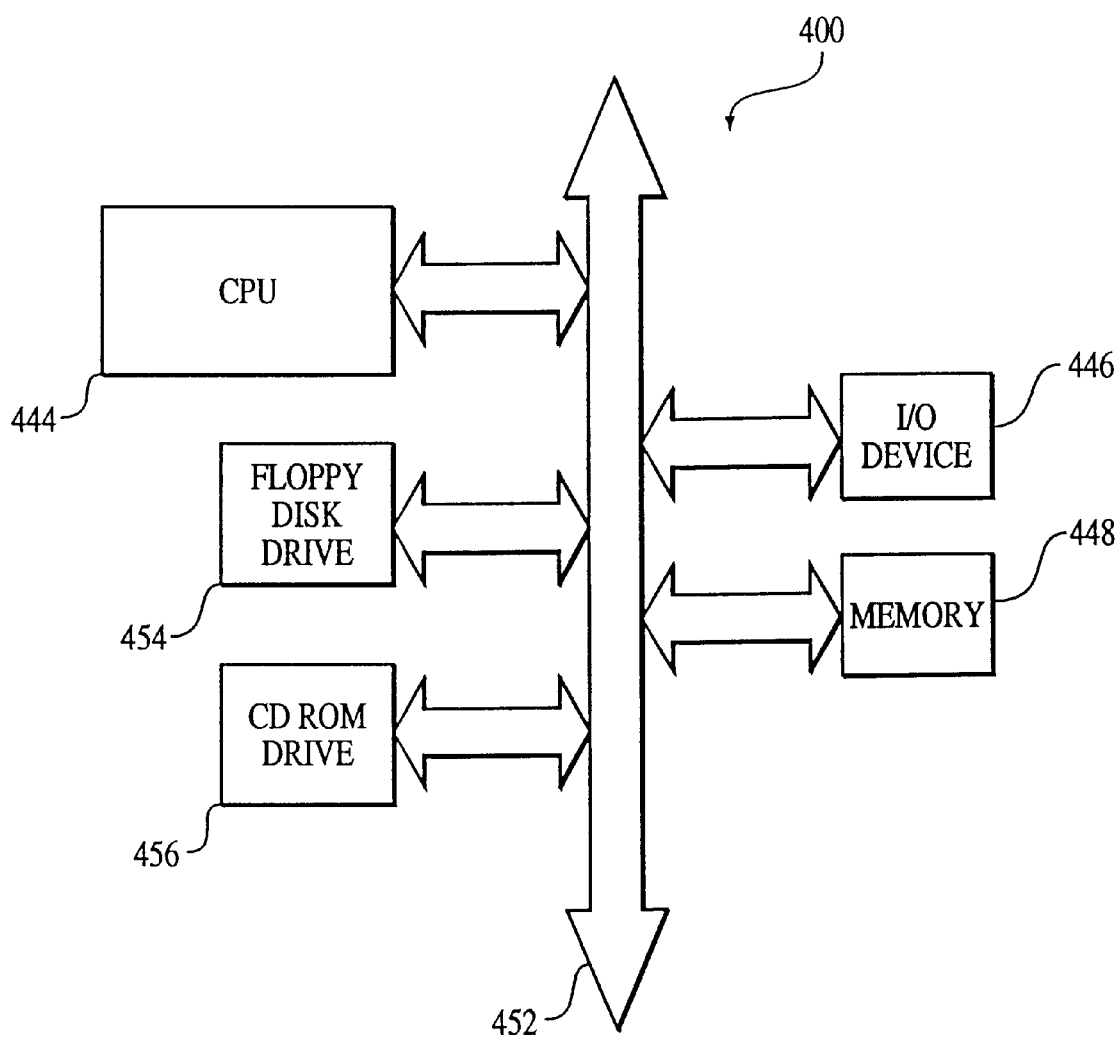
FIG. 29 is a schematic diagram of a processor system incorporating a DRAM structure of the present invention.

The minimally spaced word lines 70b, 70c (FIGS. 15–18) and 170b, 170c (FIGS. 25–27) formed in accordance with embodiments of the present invention could be used in a memory device, for example, a DRAM or SRAM, which in turn may be used in a processor system 400 which includes a memory circuit 448, for example the DRAM memory devices 100 and/or 200, as illustrated in FIG. 29. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452. The memory 448 and processor 444 may also be integrated together on the same chip. FIG. 29 illustrates only one possible processor system architecture, but it should be noted that many others are possible and well known.

Although the exemplary embodiments described above illustrate the formation of four word lines as part of the DRAM arrays 100 (FIG. 19) and 200 (FIG. 28), it is to be understood that the present invention contemplates the formation of a plurality of word lines which are minimally spaced in a memory cell array. In addition, although the embodiments described above refer to a specific topography of the gate stacks and including specific materials forming the word lines structures, it must be understood that the invention is not limited to the above-mentioned materials forming respective gate stack structures, and other compositions and layers may be used also, in accordance with the characteristics of the IC device to be fabricated.

Further, although the invention has been described with reference to the formation of word lines in a DRAM memory array, it must be understood that the invention is not limited to the formation of DRAM arrays, and other memories such as SRAMs, for example, may be formed also. Also, the invention may be used to create other minimally spaced structures in an integrated circuit.

Therefore, the above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory structure comprising:
    a plurality of word lines formed over a semiconductor substrate, at least two adjacent ones of said plurality of word lines being spaced apart from each other by a distance of less than 400 Angstroms.

2. The memory structure of claim 1 further comprising a plurality of bit lines formed over and in contact with said plurality of word lines.

3. The memory structure of claim 1, further comprising an isolation region formed below said at least two adjacent ones of said plurality of word lines being spaced apart from each other by a distance of less than 400 Angstroms.

4. The memory structure of claim 1, wherein each of said plurality of word lines further comprises a plurality of gate layers.

5. The memory structure of claim 4, wherein each of said plurality of word lines includes a polysilicon layer.

6. The memory structure of claim 4, wherein each of said plurality of word lines includes a metal silicide layer.

7. The memory structure of claim 1, wherein said memory structure is a DRAM structure.

8. The memory structure of claim 1, wherein said memory structure is a SRAM structure.

9. A memory device comprising a plurality of DRAM cells, said DRAM cells including a plurality of word lines formed over a semiconductor substrate, at least two of said plurality of word lines being spaced apart from each other by a distance less than about 400 Angstroms, and a plurality of bit lines formed over said plurality of word lines.

10. The memory device of claim 9 further comprising an isolation region formed below and in contact with said at least two of said plurality of word lines being spaced apart from each other by a distance less than about 400 Angstroms.

* * * * *